United States Patent
Xu et al.

(10) Patent No.: US 9,907,167 B1
(45) Date of Patent: Feb. 27, 2018

(54) METHOD FOR MANUFACTURING A PRINTED CIRCUIT BOARD WITH HIGH-CAPACITY COPPER CIRCUIT

(71) Applicants: Avary Holding (Shenzhen) Co., Limited, Shenzhen (CN); HongQiSheng Precision Electronics (QinHuangDao) Co., Ltd., Qinhuangdao (CN)

(72) Inventors: Fang-Bo Xu, Shenzhen (CN); Peng Wu, Shenzhen (CN); Jian-Quan Shen, Shenzhen (CN); Ke-Jian Wu, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 15/394,735

(22) Filed: Dec. 29, 2016

(30) Foreign Application Priority Data

Oct. 6, 2016 (CN) .......................... 2016 1 0880403

(51) Int. Cl.
*H05K 3/02* (2006.01)
*H05K 3/10* (2006.01)
*H05K 1/09* (2006.01)
*H05K 1/11* (2006.01)
*H05K 3/00* (2006.01)
*H05K 3/18* (2006.01)
*H05K 3/28* (2006.01)
*H05K 1/02* (2006.01)
*H05K 3/46* (2006.01)

(52) U.S. Cl.
CPC ............. *H05K 1/09* (2013.01); *H05K 1/0225* (2013.01); *H05K 1/111* (2013.01); *H05K 3/0026* (2013.01); *H05K 3/188* (2013.01); *H05K 3/282* (2013.01); *H05K 3/4682* (2013.01); *H05K 2201/0137* (2013.01); *H05K 2201/0154* (2013.01); *H05K 2203/0228* (2013.01); *H05K 2203/107* (2013.01); *Y10T 29/49155* (2015.01)

(58) Field of Classification Search
CPC .......... H01L 23/49822; H01L 21/4857; Y10T 29/49155; Y10T 29/49124
USPC ................... 29/846, 825, 829, 848
See application file for complete search history.

(56) References Cited

U.S. PATENT DOCUMENTS 5,665,525 A * 9/1997 Pienimaa ............... H05K 1/115
216/17
9,295,150 B2 * 3/2016 Hu ....................... H05K 3/4602

* cited by examiner

*Primary Examiner* — Thiem Phan
(74) *Attorney, Agent, or Firm* — ScienBiziP, P.C.

(57) ABSTRACT

A printed circuit board with high-capacity copper circuit includes a conductive trace, a first protecting layer, and a second protecting layer formed on opposite sides of the conductive trace. The conductive trace includes a base conductive trace pattern, a first conductive trace pattern, and a second conductive trace pattern. The first and second conductive trace patterns are directly formed on opposite surfaces of the base copper conductive trace pattern. A trace width of the first conductive trace pattern is the same as a line width of the second conductive trace pattern.

10 Claims, 7 Drawing Sheets

US 9,907,167 B1

METHOD FOR MANUFACTURING A PRINTED CIRCUIT BOARD WITH HIGH-CAPACITY COPPER CIRCUIT

TECHNICAL FIELD

The subject matter herein generally relates to printed circuit boards.

BACKGROUND

A printed circuit board (PCB) generally includes a circuit layer for transmitting electric signals and connecting electronic components. A circuit line width of a PCB production process is limited to a thickness of a copper. Only thin copper has been used to form fine conductive traces.

BRIEF DESCRIPTION OF THE DRAWINGS

Implementations of the present technology will now be described, by way of example only, with reference to the attached figures.

DETAILED DESCRIPTION

Figure 1:
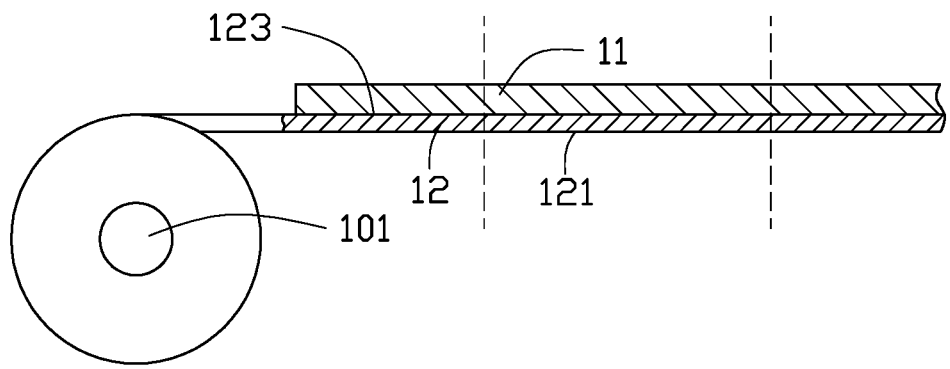
FIG. 1 illustrates a flexible base copper provided as a foil on a roll.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined as essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 15:
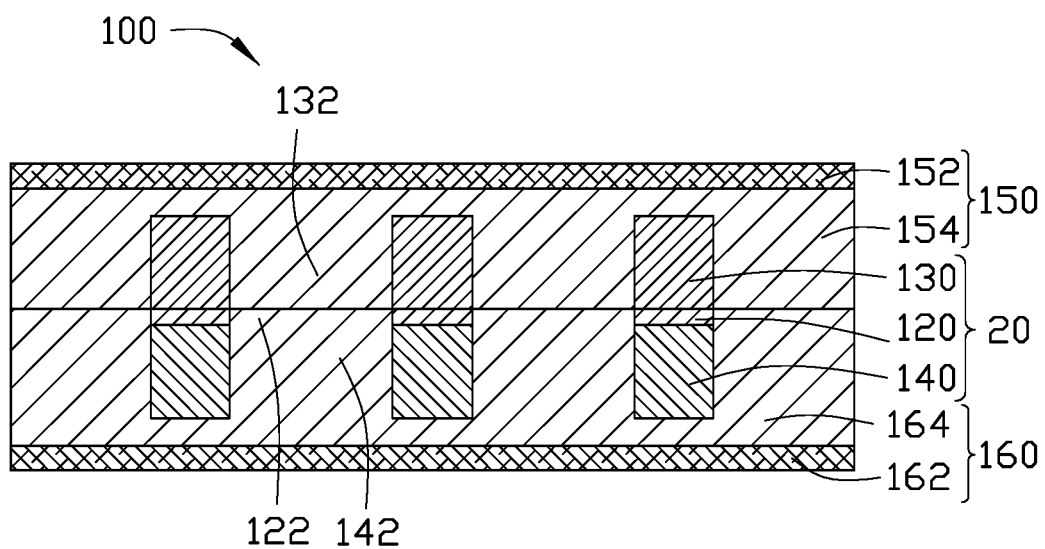
FIG. 15 is a cross-sectional view of a second protecting layer laminated on the second conductive trace pattern.

FIG. 15 illustrates a printed circuit board with thick copper circuit 100 according to a first exemplary embodiment. The printed circuit board with thick copper circuit 100 includes a conductive trace 20, a first protecting layer 150, and a second protecting layer 160, where the first protecting layer 150 and the second protecting layer 160 are formed on opposite sides of the conductive trace 20. The conductive trace 20 includes a base conductive trace pattern 120, a first conductive trace pattern 130, and a second conductive trace pattern 140. The base conductive trace pattern 120 is sandwiched between the first conductive trace pattern 130 and the second conductive trace pattern 140.

In this exemplary embodiment, the first conductive trace pattern 130 and the second conductive trace pattern 140 are directly formed on opposite surfaces of the base copper conductive trace pattern 120 by using a copper plating method, for example. The first conductive trace pattern 130 and the second conductive trace pattern 140 are in electrical contact with the base conductive trace pattern 120. A circuit line width of the base conductive trace pattern 120, a circuit line width of the first conductive trace pattern 130, and a circuit line width of the second conductive trace pattern 140 are substantially the same. A thickness of the first conductive trace pattern 130 is equal to a thickness of the second conductive trace pattern 140. In the illustrated embodiment, a thickness of the first conductive trace pattern 130 and a thickness of the second conductive trace pattern 140 is in a range from about 60 to 70 microns (i.e., 60 to 70*10^-6 meters).

The first protecting layer 150 covers the first conductive trace pattern 130, and fills in the first gaps 132 between the first conductive trace pattern 130. The second protecting layer 160 covers the second conductive trace pattern 140, and fills in the second gaps 142 between the second conductive trace pattern 140 and the gaps between the base conductive trace pattern 122. In the illustrated embodiment, the first protecting layer 150 is a CoverLay (CVL), and includes a base layer 152 and an adhering layer 154 formed on the base layer 152.

Figure 16:
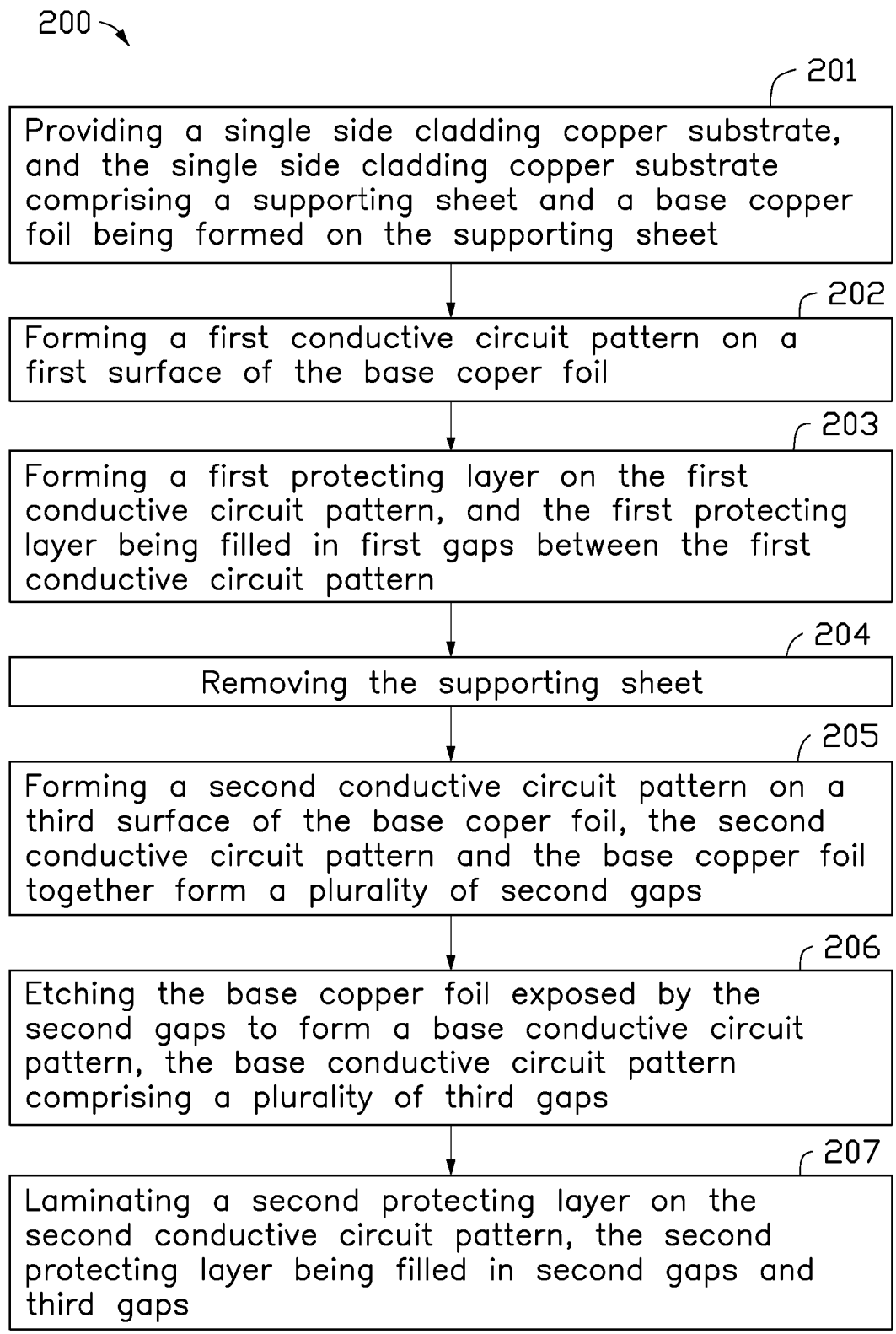
FIG. 16 is a flowchart of a method for manufacturing the printed circuit board with thick copper circuit.

FIG. 16 illustrates a flowchart of a manufacturing method in accordance with a second exemplary embodiment. An exemplary method 200 for manufacturing the thick copper circuit 100 (shown in FIG. 15) is provided by way of an example, as there are a variety of ways to carry out the method. Additionally, the illustrated order of blocks is by way of example only. The order of the blocks may change. The method 200 can begin at block 201, as shown in FIG. 16.

Figure 2:
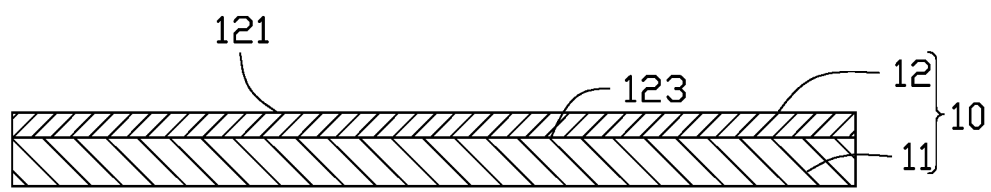
FIG. 2 is a cross-sectional view of a single side copper cladding substrate.

At block 201, with reference to FIG. 1 and FIG. 2, a single side copper cladding substrate 10 is provided. The single side copper cladding substrate 10 includes a supporting sheet 11 and a base copper foil 12. The base copper foil 12 includes a first surface 121 and a second surface 123 opposite to the first surface 121. The supporting sheet 11 is located on the second surface 123. The supporting sheet 11 is selected from a group consisting of polyethylene glycol terephthalate (PET), poly naphthalene dicarboxylic acid glycol ester (PEN), and polyimide (PI).

In the illustrated embodiment, a method of providing the single side copper cladding substrate 10 includes the following steps. First, as shown in FIG. 1, a roll (roll 101) of flexible base copper foil 12 is provided and the base copper foil 12 is unrolled. The thickness of the base copper foil 12 is about 18 micrometers. The base copper foil 12 includes the first surface 121 and the second surface 123 opposite to the first surface 121. Second, the supporting sheet 11 is laminated to the second surface 123, and then the base copper foil 12 adhered to the supporting sheet 11 is cut to a required size, thereby forming a plurality of pieces of the single side copper cladding substrate 10. In other embodiments, the supporting sheet 11 is provided from a wrapped roll and the supporting sheet 11 is unrolled. A copper plating method or a copper deposition method or a sputtering process can then be used to form the base copper foil 12 on the supporting sheet 11, creating a single side copper cladding substrate 10.

Figure 3:
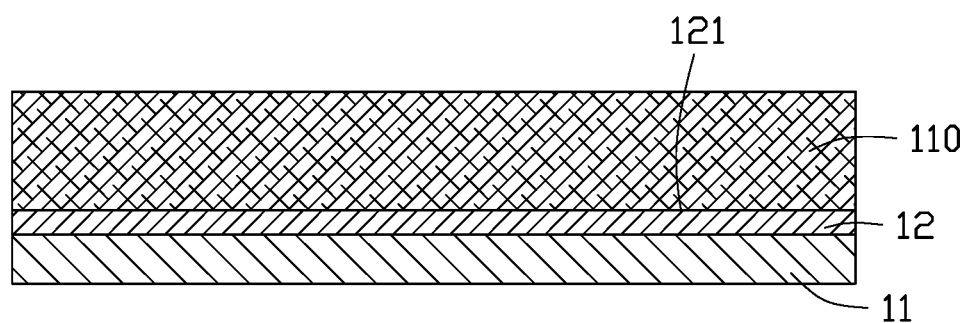
FIG. 3 is a cross-sectional view of a photosensitive film laminated to a first surface of the base copper foil.

At block 202, with reference to FIG. 3 to FIG. 6, a first conductive trace pattern 130 is formed on the first surface 121 by using a copper electroplating method, for example. Forming a first conductive circuit pattern on a first surface of the base copper foil. In the illustrated embodiment, a method for forming the first conductive trace pattern 130 is as follows:

As shown in FIG. 3, a photosensitive film 110 is adhered to the first surface 121, a thickness of the photosensitive film 110 is about 75 microns.

Figure 4:
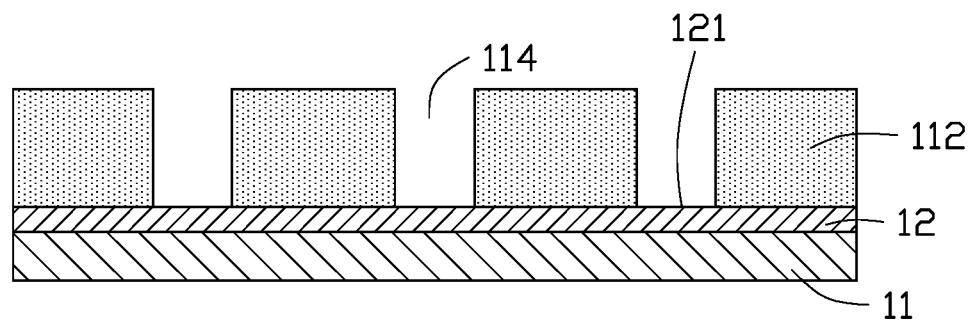
FIG. 4 is a cross-sectional view of the photosensitive film exposed, developed, and etched as a shielding layer on the first surface.

As shown in FIG. 4, the photosensitive film 110 is exposed, developed, and etched. As a result, a first shielding layer 112 is formed on the first surface 121. The first shielding layer 112 includes a plurality of openings 114. The openings 114 expose portions of the base copper foil 12.

Figure 5:
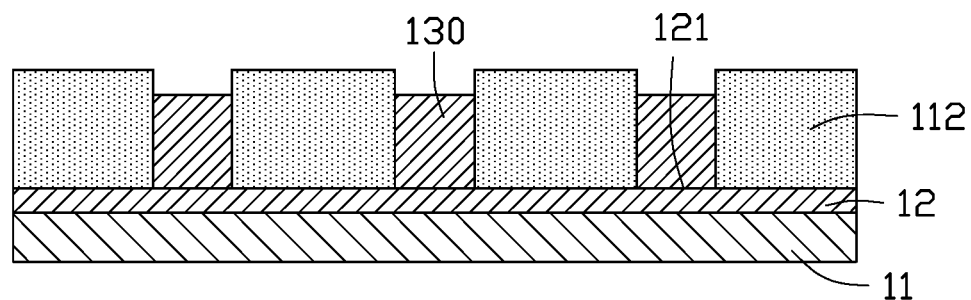
FIG. 5 is a cross-sectional view of a plating copper layer formed on the openings of the shielding layer using a copper plating method.

With reference to FIG. 5, a copper layer is formed in the openings 114 by using a electroplating method, for example. The plated copper layer forms the first conductive trace pattern 130.

Figure 6:
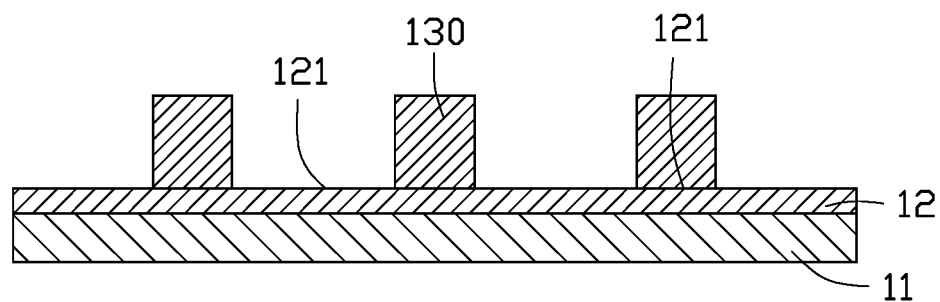
FIG. 6 is a cross-sectional view of the shielding layer removed from the first surface.

With reference to FIG. 6, the first shielding layer 112 is removed from the first surface 121. The first conductive trace pattern 130 is situated on the surface 121 of the base copper foil 12.

Figure 7:
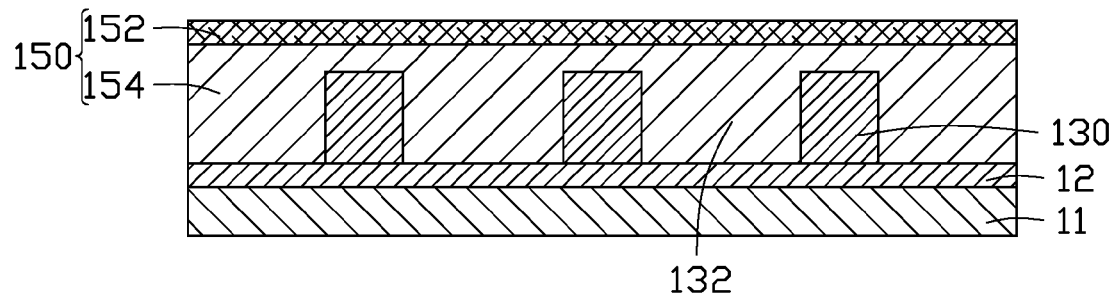
FIG. 7 is a cross-sectional view of a first protecting layer laminated on the first conductive trace pattern.

At block 203, with reference to FIG. 7, a first protecting layer 150 is laminated on the first conductive trace pattern 130, where the first protecting layer 150 is impregnated. The first protecting layer 150 protects the first conductive trace pattern 130 from oxidation, scratches, and so on. In the illustrated embodiment, the first protecting layer 150 is CoverLay (CVL), and includes a base layer 152 and an adhering layer 154 formed on the base layer 152. The adhering layer 154 fills in the first gaps 132 formed by the base copper foil 12 and the first conductive trace pattern 130, and covers the first conductive trace pattern 130. In another exemplary embodiment, the first protecting layer 150 is a solder mask.

Figure 8:
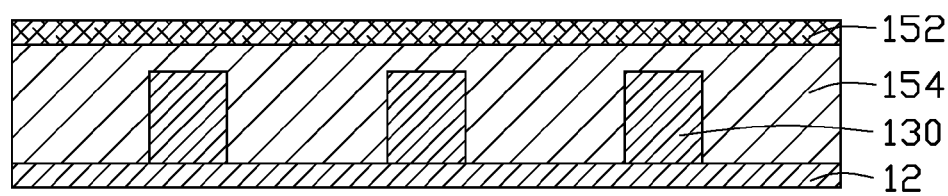
FIG. 8 is a cross-sectional view of the supporting sheet removed from the base copper foil.
Figure 9:
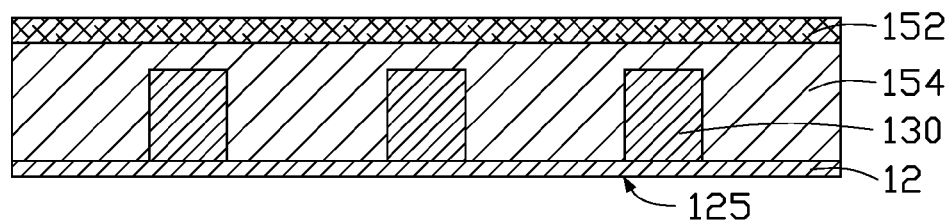
FIG. 9 is a cross-sectional view of the base copper foil reduced using a gridding method.

At block 204, with reference to FIG. 8 and FIG. 9, the supporting sheet 11 (as shown in FIG. 7) is removed from the base copper foil 12, and thickness of the base copper foil 12 is reduced by using a gridding method, for example. A thickness of the base copper foil 12 is reduced. The second surface 123 is removed by grinding, resulting a third surface 125. In this way, a thickness of the base copper foil 12 retains about 2 to 6 microns.

At block 205, with reference to FIG. 10 to FIG. 13, a second conductive trace pattern 140 is formed on the third surface 125. The shape of the second conductive trace pattern 140 is the same as the shape of the first conductive trace pattern 130, and a thickness of the second conductive trace pattern 140 is substantially equal to a thickness of the first conductive trace pattern 130.

In the illustrated embodiment, the second conductive trace pattern 140 is formed using the same method as that used for the first conductive trace pattern 130. That is to say, the second conductive trace pattern 140 is formed in the following way.

Figure 10:
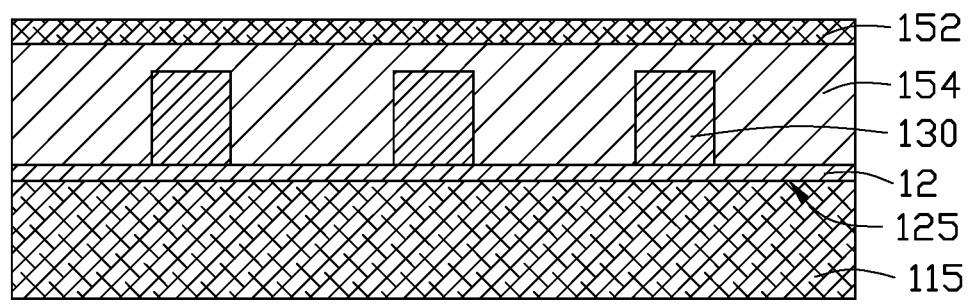
FIG. 10 is a cross-sectional view of a photosensitive film laminated to a third surface of the copper sheet.

Firstly, as shown in FIG. 10, a photosensitive film 115 is laminated to the third surface 125.

Figure 11:
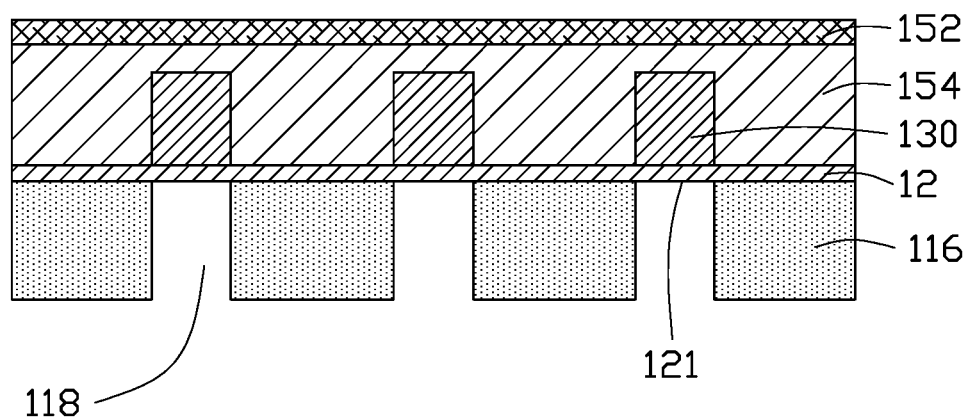
FIG. 11 is a cross-sectional view of a second shielding layer formed on the third surface.

Secondly, the photosensitive film 115 is exposed, developed, and etched to form a second shielding layer 116 on the third surface 125, as shown in FIG. 11. The second shielding layer 116 includes a plurality of openings 118, the openings 118 are configured to expose portions of the base copper foil 12.

Figure 12:
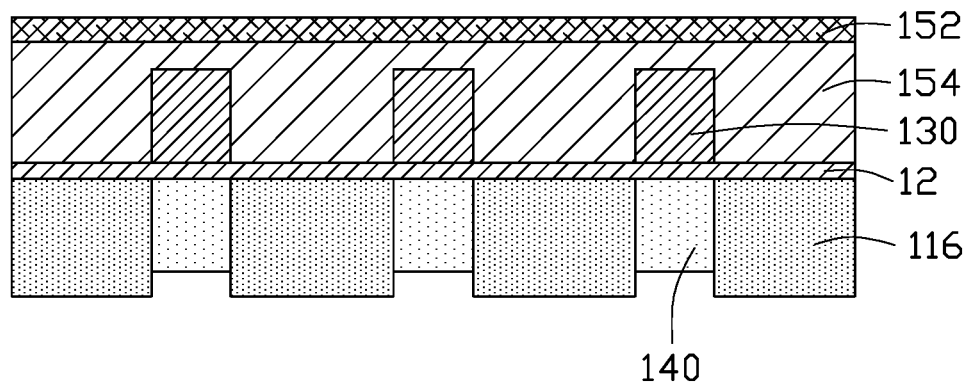
FIG. 12 is a cross-sectional view of a plating copper layer formed on the openings using a electroplating method.

As shown in FIG. 12, a copper layer is formed in the openings 118 by using an electroplating method, for example. The plating copper layer is configured to form the second conductive trace pattern 140.

Figure 13:
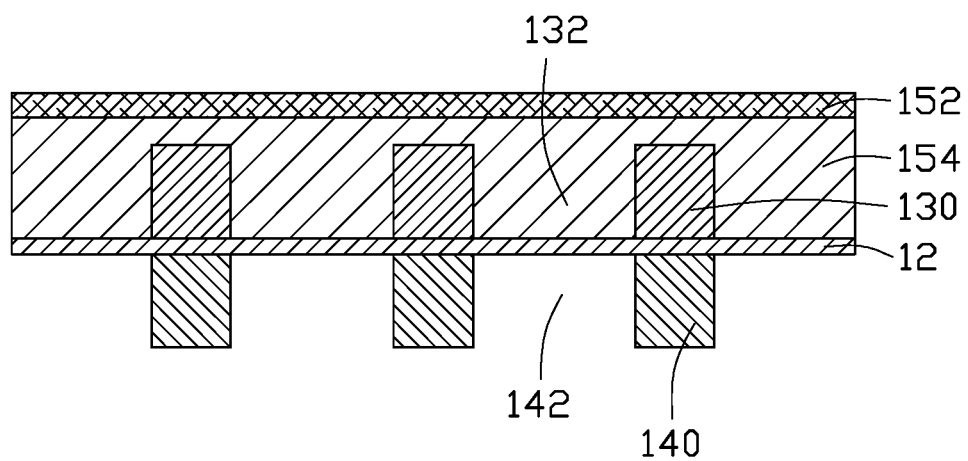
FIG. 13 is a cross-sectional view of the second shielding layer removed to form the second conductive trace pattern on the third surface.

As shown in FIG. 13, the second shielding layer 116 is removed from the base copper foil 12, and the second conductive trace pattern 140 is situated on the third surface 125. The respective thicknesses of the first conductive trace pattern 130 and of the second conductive trace pattern 140 are in a range from about 60 to 70 microns.

Figure 14:
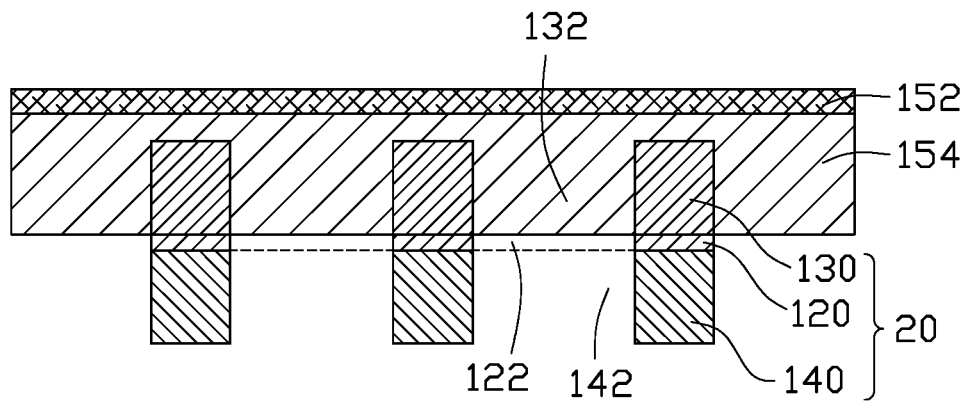
FIG. 14 is a cross-sectional view of the base copper foil etched to form a base conductive trace pattern.

At block 206, with reference to FIG. 14, the base copper foil 12, that is exposed by the third gaps 122, is removed by etching, and the remaining portions of the base copper foil 12 is configured to form a base conductive trace pattern 120. The third gaps 122 between the base conductive trace pattern 120, the first gaps 132 between the first conductive trace pattern 130, and the second gaps 142 between the second conductive trace pattern 140 are aligned with each other. That is, the widths of the wires of the base conductive trace pattern 120, of the first conductive trace pattern 130, and of the second conductive trace pattern 140 are substantially the same. The base conductive trace pattern 120, the first conductive trace pattern 130, and the second conductive trace pattern 140 together form the conductive trace 20. A thickness of the conductive trace 20 is about 122 microns to 146 microns. In a preferred embodiment, a thickness of the conductive trace 20 is about 125 microns.

At block 207, with reference to FIG. 15, a second protecting layer 160 is laminated on the second conductive trace pattern 140. The second protecting layer 160 also fills in the second gaps 142 between the second conductive trace pattern 140, and the third gaps 122 between the base conductive trace pattern 120. The circuit conductive 20 is formed by using an etching method and an electroplating method, for example. A thickness of the conductive trace 20 is about 125 microns. Thereby, the printed circuit board with thick copper circuit 100 is obtained.

When the printed circuit board with thick copper circuit 100 is in use, openings are formed in the first protective layer 150 and second protection layer 160 by a laser cutting method, and part of the conductive trace 20 is exposed. The exposed portions can be used as pads, and electronic components can be arranged on such pads.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for manufacturing a printed board with high-capacity copper circuit comprising:
    providing a single side cladding copper substrate, and the single side cladding copper substrate comprising a supporting sheet and a base copper foil on the supporting sheet;
    forming a first conductive trace pattern on a surface a surface of the base copper foil;
    forming a first protecting layer on the first conductive trace pattern, and the first protecting layer being filled in first gaps between the first conductive trace pattern;
    removing the supporting sheet;
    forming a second conductive trace pattern on another surfaces of the base copper foil, the second conductive trace pattern and the base copper foil together form a plurality of second gaps;
    etching the base copper foil exposed by the second gaps to form a base conductive trace pattern, the base conductive trace pattern comprising a plurality of third gaps; and
    laminating a second protecting layer on the second conductive trace pattern, the second protecting layer being filled in the plurality of second gaps and the plurality of third gaps.

2. The method of claim 1, wherein a method of providing the single side copper cladding substrate comprising:
    providing a roll of base copper foil;
    rolling out the base copper foil from the roll, the base copper foil comprising a first surface and a second surface opposite to the first surface;
    adhering a supporting sheet to the second surface;
    cutting the base copper foil adhered to the supporting sheet to a required size, thereby forming a plurality of pieces of the single side cover copper sheet.

3. The method of claim 2, wherein a method for forming the first conductive trace pattern comprising the steps of:
    a photosensitive film is adhered to the first surface;
    exposing and developing the photosensitive film to form a shielding layer on the first surface, the shielding layer comprises a plurality of openings, the openings exposes the base copper foil;
    electroplating a copper layer on the openings;
    removing the shielding layer from the first surface, thereby forming the first conductive trace pattern on the surface of the base copper foil.

4. The method of claim 3, wherein a shape of the first conductive trace is the same as a shape of the second conductive trace pattern.

5. The method of claim 4, wherein a line width of the first conductive trace pattern is the same as a line width of the second conductive trace pattern.

6. The method of claim 4, wherein a thickness of the first conductive trace pattern is the same as a thickness of the second conductive trace pattern.

7. The method of claim 6, wherein a line width of the base copper conductive trace pattern is the same as a line width of the second conductive trace pattern.

8. The method of claim 2, wherein the supporting sheet is select from the group consisting of polyethylene glycol terephthalate, poly naphthalene dicarboxylic acid glycol ester, or polyimide.

9. The method of claim 1, wherein after the step of removing the supporting sheet from the base copper foil and before the step of forming a second conductive trace pattern on the other surfaces of the base copper foil, further comprises a step of gridding the second surface of the base copper foil to reduce a thickness of the base copper foil.

10. The method of claim 1, wherein the first protecting layer and the second protecting layer are select from prepregnant and solder mask.

* * * * *